(12) United States Patent
Sekiguchi

(10) Patent No.: US 7,411,265 B2
(45) Date of Patent: Aug. 12, 2008

(54) PHOTODIODE AND PHOTOTRANSISTOR

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 128 days.

(21) Appl. No.: 11/463,347

(22) Filed: Aug. 9, 2006

(65) Prior Publication Data

US 2007/0034980 A1   Feb. 15, 2007

(30) Foreign Application Priority Data

Aug. 9, 2005   (JP) ............................... 2005-231143

(51) Int. Cl.
    *H01L 31/06* (2006.01)
(52) U.S. Cl. ....................... 257/461; 257/659
(58) Field of Classification Search ................. 257/461, 257/462, 659
    See application file for complete search history.

(56) References Cited

U.S. PATENT DOCUMENTS

2007/0034980 A1 *  2/2007  Sekiguchi ................... 257/462

\* cited by examiner

*Primary Examiner*—Mark Prenty
(74) *Attorney, Agent, or Firm*—Keating & Bennett, LLP

(57) ABSTRACT

A phototransistor includes a first-conduction-type lower region, a second-conduction-type upper region disposed on the first region, a second-conduction-type electrode contact region of a high concentration disposed at a surface inside of the upper region and is connected to an electrode so as to transmit a signal, a first-conduction-type first shield region of a high concentration disposed at the surface of the upper region and spaced at an interval from the electrode contact region and connected to a ground potential, and a first-conduction-type second shield region of a low concentration disposed between the electrode contact region and the first shield region at the surface of the upper region so as to surround the electrode contact region, and further, is connected to the ground potential.

5 Claims, 4 Drawing Sheets

PHOTODIODE AND PHOTOTRANSISTOR

BACKGROUND OF THE INVENTION

1. Field of the Invention

The present invention relates to a photodiode and a phototransistor including the photodiode.

2. Description of the Related Art

A photodiode has been widely used as a pickup for reading information from an image sensor or an optical disk such as a CD or a DVD.

A typical photodiode in the prior art has a structure, in which, for example, an N type impurity region and an electrode contact region of an $N^+$ type (a high concentration N type) having an electrode connected to the inside of the N type impurity region are provided at a surface of a $P^+$ type (a high concentration P type) substrate. In such a photodiode, light incident from the surface of the N type impurity region is optoelectronically transduced at a junction surface between the N type impurity region and the $P^+$ type substrate. The resultant electric charge is transmitted out of the electrode connected to the electrode contact region as a signal representing a light reception intensity.

When a power source, OA equipment, or other electronic component is arranged near the above-described photodiode, the photodiode might not output the signal representing the light reception intensity but instead a noise signal caused by an adverse influence of an electromagnetic wave (i.e., an electromagnetic noise) generated by the peripheral component. When the photodiode outputs the noise signal by the adverse influence of the electromagnetic wave in the case where, for example, the photodiode is incorporated in an image sensor, an undesired image such as a stripe pattern appears on an image reproduced from an output from the image sensor.

In view of this, a $P^+$ type diffused region 94 is provided at an outermost surface of a $P^+$ type substrate 93 having an N type impurity region 91 and an $N^+$ type electrode contact region 92 so as to surround the electrode contact region 92, and further, the $P^+$ type diffused region 94 is connected to a ground potential, as shown in FIG. 5. The impedance of the $P^+$ type diffused region 94 becomes low by connecting the $P^+$ type diffused region 94 to the ground potential so that the $P^+$ type diffused region 94 exhibits a shield effect against an electromagnetic wave. As a consequence, even if the electromagnetic wave intrudes at the surface of the photodiode through an electronic component arranged near the photodiode, the electromagnetic wave can be shielded in the $P^+$ type diffused region 94, thereby preventing any generation of an electric charge caused by the electromagnetic wave.

Since the electrode contact region 92 and the $P^+$ type diffused region 94 are arranged adjacent to each other, a pn junction of a high impurity concentration is formed, and therefore, a tunnel current flows between the electrode contact region 92 and the $P^+$ type diffused region 94 caused by Zener breakdown. In addition, the electric charge is concentrated at the junction between the electrode contact region 92 and the $P^+$ type diffused region 94 thereby raising another problem of a reduced withstand voltage at the junction. Thus, the electrode contact region 92 and the $P^+$ type diffused region 94 must be arranged to have a certain interval therebetween.

However, if the electrode contact region 92 and the $P^+$ type diffused region 94 are separated from each other, the electromagnetic wave cannot be shielded in a region defined between the electrode contact region 92 and the $P^+$ type diffused region 94 from entering into the N type impurity region 91 through the above-described region, thereby raising a possibility that a signal (i.e., an electric charge) caused by the electromagnetic wave may be output from the electrode connected to the electrode contact region 92.

SUMMARY OF THE INVENTION

In order to overcome the problems described above, preferred embodiments of the present invention provide a photodiode capable of shielding an electromagnetic wave from outside the photodiode, and a phototransistor including the photodiode.

A photodiode according to a first preferred embodiment includes a first-conduction-type lower region, a second-conduction-type upper region arranged on the first region, a second-conduction-type electrode contact region of a high concentration (having a concentration of second-conduction-type impurities higher than that of the upper region) arranged at a surface of the upper region and connected to an electrode for transmitting an output signal, a first-conduction-type first shield region of a high concentration arranged at the surface of the upper region with an interval from the electrode contact region and connected to a ground potential, and a first-conduction-type second shield region of a low concentration (having a concentration of first-conduction-type impurities lower than that of the first shield region) arranged between the electrode contact region and the first shield region at the surface of the upper region so as to surround the electrode contact region, wherein the first-conduction-type second shield region is connected to the ground potential.

With the above-described configuration, the second shield region is provided at the surface of the upper region so as to surround the electrode contact region, and further, the first shield region is provided outside of the second shield region. Consequently, an electromagnetic wave intruding into the surface of the photodiode from the outside can be shielded by the first shield region and the second shield region. In other words, with the configuration described and shown in FIG. 5, since the electrode contact region 92 and the $P^+$ type diffused region 94 are separated from each other, the electromagnetic wave could not be shielded by the region between the electrode contact region 92 and the $P^+$ type diffused region 94, thereby raising a concern of intrusion of the electromagnetic wave into the N type impurity region 91. In contrast, with the configuration according to the preferred embodiments of the present invention, the electromagnetic wave intruding between the electrode contact region and the first shield region can be shielded by the second shield region provided between the electrode contact region and the first shield region. Thus, it is possible to shield an electromagnetic wave intruding from outside the photodiode. Additionally, even if the second-conduction-type electrode contact region of a high concentration and the second shield region are arranged adjacent to each other, no pn junction of a high impurity concentration is formed since the second shield region is of the first conduction type of a low concentration, and consequently, no tunnel current is generated due to Zener breakdown. Moreover, a withstand voltage cannot be reduced at a junction between the second shield region and the electrode contact region.

According to another preferred embodiment of the present invention, a phototransistor includes a device separation region arranged around a photodiode region, the photodiode according to the first preferred embodiment inside the photodiode region, and an output transistor arranged outside of the photodiode region and separated from the photodiode via the device separation region so as to amplify a signal to be output from the photodiode.

With the above-described configuration, the electromagnetic wave intruding into the surface of the photodiode from the outside can be shielded by the use of the photodiode according to the first preferred embodiment. As a consequence, there is neither a concern of outputting a noise signal caused by the electromagnetic wave from the electrode in the photodiode nor a concern of amplification of such a noise signal in an output transistor.

The electrode contact region is arranged at a peripheral edge of the photodiode region. With the above-described configuration, the electrode contact region in the phototransistor is arranged at the peripheral edge of the photodiode region, thereby reducing the length of a wiring for connecting the electrode contact region to a gate electrode in an output transistor. As a result, it is possible to reduce a parasitic capacity generated between the wiring and the upper region, so as to enhance the sensitivity of the photodiode.

The device separation region includes a trench extending in a thickness direction of the lower region from the surface of the upper region, wherein the phototransistor further includes a first-conduction-type connection region for connecting the second shield region and the lower region to each other along the trench.

With the above-described configuration, the first-conduction-type second shield region of a low concentration can be connected to the first-conduction-type lower region via the first-conduction-type connection region provided along the trench. As a consequence, the second shield region can be connected to the ground potential by a simple structure.

The connection region is arranged on the entire circumference of an interface between the trench and the upper region, wherein the first shield region is connected to the lower region via the connection region. With the above-described configuration, the first-conduction-type first shield region of a high concentration can be connected to the first-conduction-type lower region via the first-conduction-type connection region provided along the trench. As a consequence, the first shield region can be connected to the ground potential by a simple structure.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
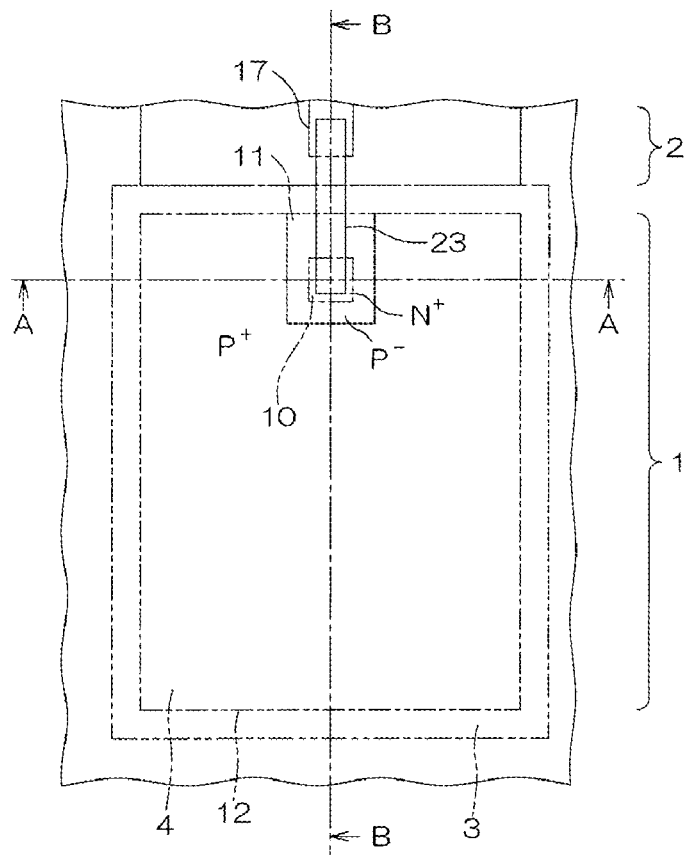
FIG. 1 is a plan view showing a phototransistor in a diagrammatic form according to a first preferred embodiment of the present invention.

FIG. 1 is a plan view showing a phototransistor in a diagrammatic form in a first preferred embodiment of the present invention. The phototransistor includes a photodiode 1 for receiving light so as to output an electric signal according to a light reception intensity, and an output transistor 2 for amplifying the electric signal output from the photodiode 1.

The photodiode 1 is provided inside of a photodiode region 4 which preferably has a substantially rectangular shape, as viewed in plan, and surrounded by a device separation region 3. On the other hand, the output transistor 2 is arranged outside of the photodiode region 4 and is separated from the photodiode via the device separation region 3.

Figure 2:
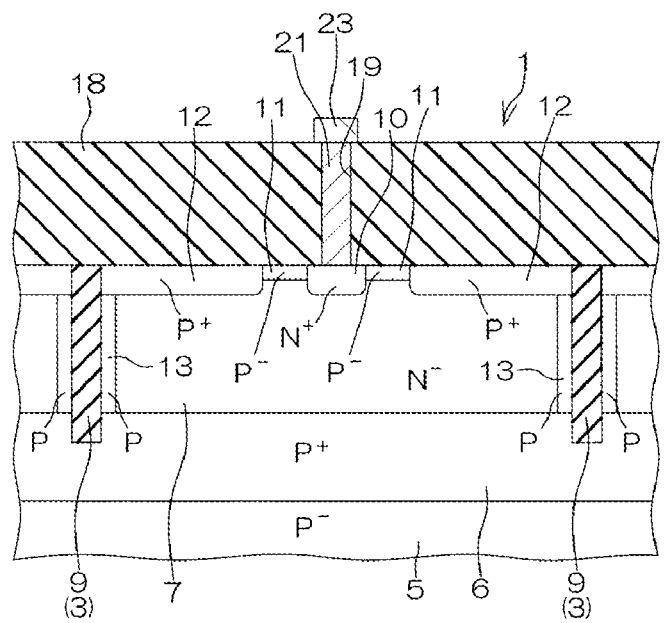
FIG. 2 is a schematic cross-sectional view showing the phototransistor shown in FIG. 1, taken along a line A-A.
Figure 3:
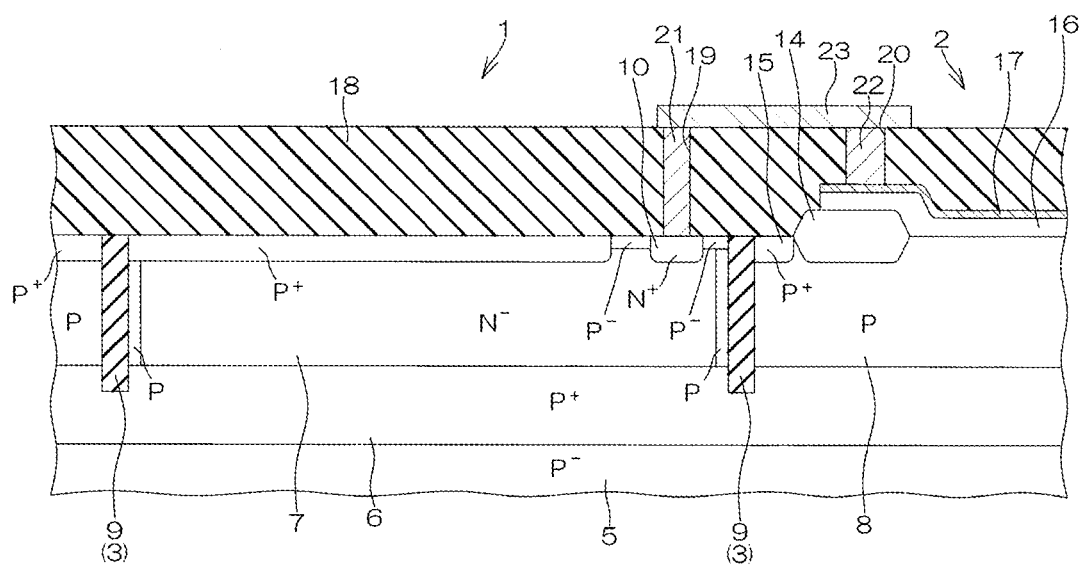
FIG. 3 is a schematic cross-sectional view showing the phototransistor shown in FIG. 1, taken along a line B-B.

FIG. 2 is a schematic cross-sectional view showing the phototransistor shown in FIG. 1, taken along a line A-A; and FIG. 3 is a schematic cross-sectional view showing the phototransistor shown in FIG. 1, taken along a line B-B.

In the phototransistor, a lower region includes a $P^+$ type (a high concentration P type) diffused layer 6 provided on a surface of a $P^-$ type (a low concentration P type) substrate 5.

On the $P^+$ type diffused layer 6, an upper region includes an $N^-$ type (a low concentration $N^-$ type) epitaxial layer 7 provided in the photodiode 1 while a P type diffused layer 8 is provided in the output transistor 2. The device separation region 3 includes a deep trench 9 arranged into a rectangular frame, as viewed in plan, having a depth from the surface of each of the $N^-$ type epitaxial layer 7 and the P type diffused layer 8 down into the $P^+$ type diffused layer 6. Therefore, the $N^-$ type epitaxial layer 7 and the P type diffused layer 8 are electrically separated from each other via the deep trench 9. The deep trench 9 is filled with, for example, polysilicon, or any other suitable material.

At the surface of the $N^-$ type epitaxial layer 7 in the photodiode 1, an $N^+$ type electrode contact region 10 is arranged, for example, at the center of a side of the photodiode region 4 adjacent the output transistor 2. The contact region 10 extends in a direction that is substantially perpendicular to a direction in which the photodiode 1 and the output transistor 2 laterally extend. Furthermore, a $P^-$ type diffused layer 11 is arranged in a rectangular frame, as viewed in plan, at the surface of the $N^-$ type epitaxial layer 7 so as to surround the electrode contact region 10. Moreover, a $P^+$ type diffused layer 12 is arranged around the $P^-$ type diffused layer 11.

As shown in FIG. 3, the $P^-$ type diffused layer 11 extends an end edge of a side of the photodiode region 4 adjacent the output transistor 2, and is connected to the deep trench 9.

The $P^+$ type diffused layer 12 is provided over the entire surface of the $N^-$ type epitaxial layer 7 except for the electrode contact region 10 and the $P^-$ type diffused layer 11 inside of the photodiode region 4.

In addition, a P type connection region 13 is arranged along the deep trench 9 in the $N^-$ type epitaxial layer 7. The connection region 13 is provided over the entire deep trench 9 so as to penetrate into the $N^-$ type epitaxial layer 7. As a consequence, the $P^-$ type diffused layer 11 and the $P^+$ type diffused layer 12 are connected to the $P^+$ type diffused layer 6 via the connection region 13.

In the output transistor 2, a LOCOS 14 is arranged at an interval from the deep trench 9 at the surface of the P type diffused layer 8. A $P^+$ type diffused layer 15 is provided between the LOCOS 14 and the deep trench 9. In addition, a gate oxide film 16 is provided on the P type diffused layer 8 so as to overlap the LOCOS 14 at one end thereof. A gate electrode 17 is arranged on the gate oxide film 16.

On the $N^-$ type epitaxial layer 7 and the P type diffused layer 8 is laminated an interlayer insulating film 18. Through the interlayer insulating film 18, in a thickness direction thereof, are formed through holes 19 and 20 for allowing the electrode contact region 10 and the gate electrode 17 to be partly exposed, respectively. A signal transmitting electrode 21 is embedded in the through hole 19 and connected to the electrode contact region 10. A through wiring 22 is embedded in the through hole 20 and connected to the gate electrode 17. Here, the signal transmitting electrode 21 and the through wiring 22 are connected to each other via a wiring 23 provided over the surface of the interlayer insulating film 18. In addition, a surface protective film, not shown, is laminated over the interlayer insulating film 18.

With the above-described configuration, in the photodiode 1, the P⁻ type diffused layer 11 is provided on the surface of the N⁻ type epitaxial layer 7 so as to surround the electrode contact region 10, and further, the P⁺ type diffused layer 12 is arranged outside of the P⁻ type diffused layer 11. The P⁻ type diffused layer 11 and the P⁺ type diffused layer 12 are connected to the P⁺ type diffused layer 6 via the connection region 13, where their potentials become equal to a ground potential of the P⁺ type diffused layer 6. As a consequence, an electromagnetic wave intruding into the surface of the photodiode 1 from the outside can be shielded in the P⁺ type diffused layer 12, and further, can be shielded by the P⁻ type diffused layer 11 between the P⁺ type diffused layer 12 and the electrode contact region 10. Thus, the photodiode 1 can exhibit an excellent shield effect against an electromagnetic wave intruding from outside the photodiode 1.

In addition, since the concentration of P type impurities contained in the P⁻ type diffused layer 11 is low even if the N⁺ type electrode contact region 10 and the P⁻ type diffused layer 11 are adjacent to each other, no pn junction of a high impurity concentration is formed between the N⁺ type electrode contact region 10 and the P⁻ type diffused layer 11. Thus, there is no concern for generation of a tunnel current caused by Zener breakdown, and further, there is no concern for reduction of a withstand voltage at the junction.

Additionally, there is no concern for an output of a noise signal from the photodiode 1 caused by the electromagnetic wave, so that such a noise signal cannot be amplified in the output transistor 2.

Moreover, the electrode contact region 10 is arranged at the end of a side of the photodiode region 4 adjacent the output transistor 2, thereby reducing the length of the wiring 23 which connects the signal transmitting electrode 21 connected to the electrode contact region 10 and the through wiring 22 connected to the gate electrode 17 in the output transistor 2. As a result, it is possible to reduce the parasitic capacity generated between the wiring 23 and the N⁻ type epitaxial layer 7 and between the wiring 23 and the P type diffused layer 8, so as to enhance the sensitivity of the photodiode 1.

Furthermore, the configuration in the present preferred embodiment has a simple structure, in which the P type connection region 13 is provided along the deep trench 9 so that the potentials of the P⁻ type diffused layer 11 and the P⁺ type diffused layer 12 can serve as the ground potentials.

Figure 4A:
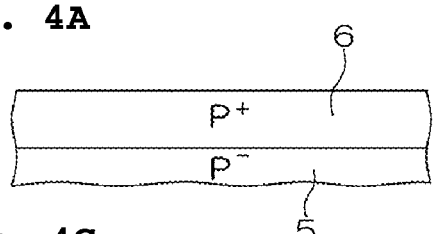
FIGS. 4A to 4G are schematic cross-sectional views illustrating processes for fabricating a photodiode shown in FIG. 1.

FIGS. 4A to 4G are schematic cross-sectional views illustrating a step-by-step preferred process for fabricating the photodiode 1. As illustrated in FIG. 4A, the P⁺ type diffused layer 6 is first provided on the surface of the P⁻ type substrate 5 by implanting P type impurities (i.e., ion implantation) from the surface of the P⁻ type substrate 5.

Figure 4B:
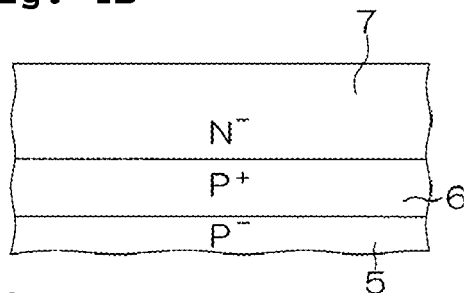

Next, as illustrated in FIG. 4B, the N⁻ type epitaxial layer 7 is formed on the P⁺ type diffused layer 6 by epitaxial growth.

Figure 4C:
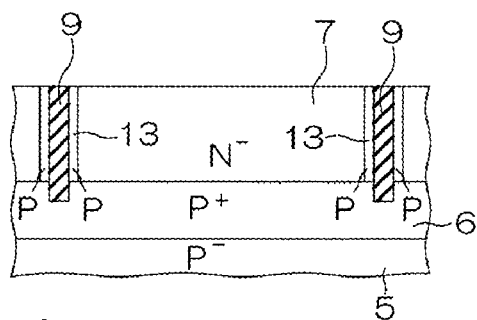

Subsequently, as illustrated in FIG. 4C, a silicon oxide film is patterned on the N⁻ type epitaxial layer 7, and then, the deep trench 9 is formed by reactive ion etching (abbreviated as "RIE") by the use of the silicon oxide film as a mask. For example, polysilicon is embedded in the deep trench 9 by vacuum CVD or the like, followed by removing the silicon oxide film on the N⁻ type epitaxial layer 7 and the polysilicon projecting from the deep trench 9. Further, the P type impurities are implanted at an interface between the deep trench 9 and the N⁻ type epitaxial layer 7, thereby forming the P type connection region 13.

Figure 4D:
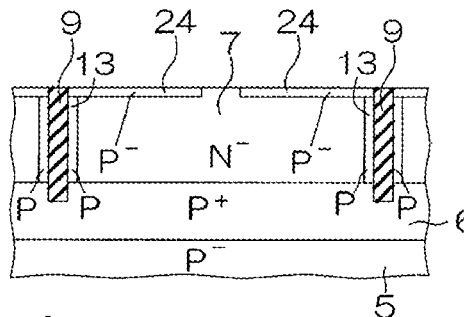

Thereafter, as illustrated in FIG. 4D, a P⁻ type diffused layer 24 is formed by implanting the P type impurities in a region except for a region corresponding to the electrode contact region 10 at the surface of the N⁻ type epitaxial layer 7.

Figure 4E:
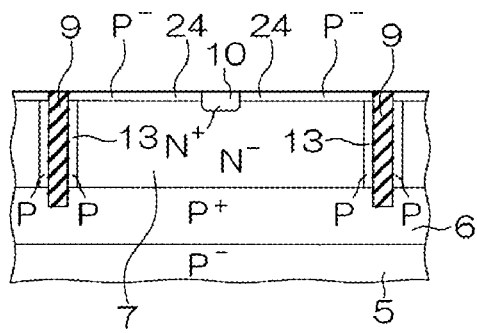

N type impurities are implanted in a high concentration in the region corresponding to the electrode contact region 10. In this manner, the conduction type in the region corresponding to the electrode contact region 10 becomes an N type of high concentration, as illustrated in FIG. 4E, thereby forming the electrode contact region 10. Here, the N type impurities may be implanted in a region somewhat wider than the region corresponding to the electrode contact region 10. Thus, it is possible to prevent any generation of a gap between the electrode contact region 10 and the P⁻ type diffused layer 24.

Figure 4F:
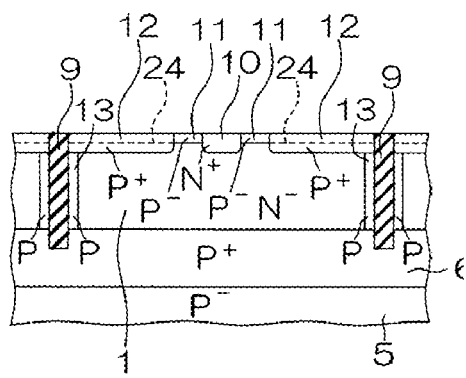

Thereafter, the P type impurities are implanted at the surface of the P⁻ type diffused layer 24 in a region except for the electrode contact region 10 and the P⁻ type diffused region 11. As a consequence, a region in which the P type impurities are further implanted becomes P⁺ on the P⁻ type diffused layer 24, thereby forming the P⁺ diffused region 12, as illustrated in FIG. 4F. In contrast, a region in which no P type impurities are implanted remains the P⁻ type on the P⁻ type diffused layer 24, so as to serve as the P⁻ type diffused region 11.

Figure 4G:
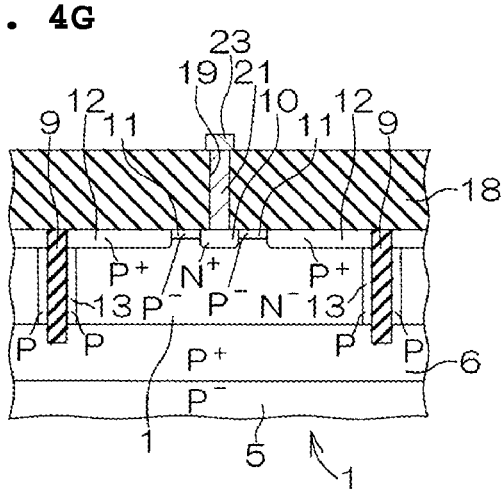
Figure 5:
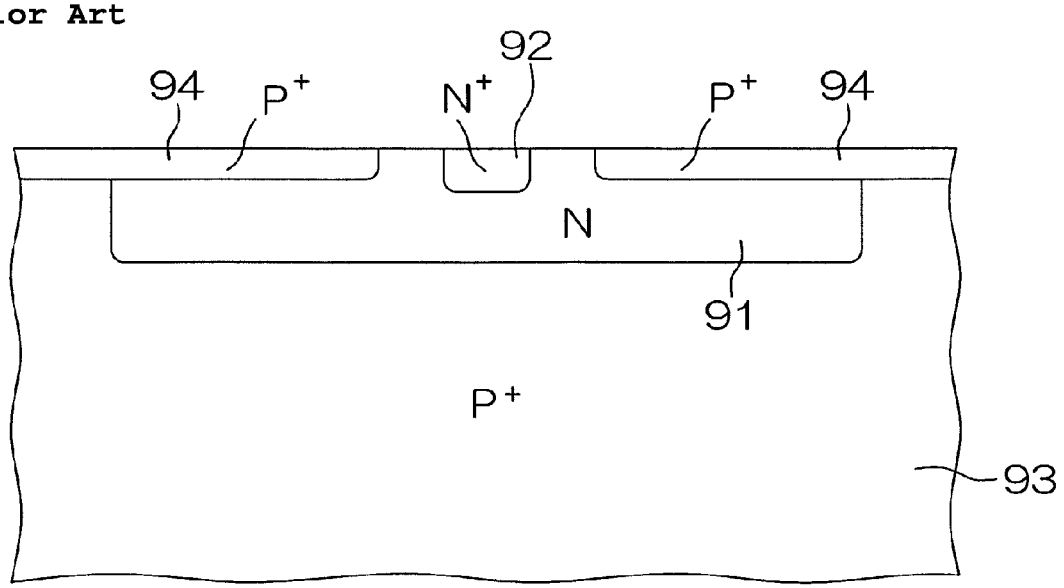
FIG. 5 is a schematic cross-sectional view showing the configuration of a photodiode in the prior art.

Through the above-described process, the interlayer insulating film 18 is formed above the substrate 5 by CVD or the like, as illustrated in FIG. 4G. Subsequently, the through hole 19 is formed through the interlayer insulating film 18 by pattern etching. And then, the signal transmitting electrode 21 is formed by completely filling the through hole 19 with a metallic material, and further, the photodiode 1 is obtained by patterning the wiring 23 on the interlayer insulating film 18.

Although preferred embodiments of the present invention have been described above, the present invention may be carried out utilizing other preferred embodiments. For example, a configuration in which the conduction type of each of the semiconductor portions in the above-described phototransistor may be reversed. Specifically, the P type in the above-described preferred embodiments may be replaced by the N type or, on the other hand, the N type may be replaced by the P type.

While the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the present invention that fall within the true spirit and scope of the present invention.

The present application corresponds to Japanese Patent Application No. 2005-231143 filed in the Japanese Patent Office on Aug. 9, 2005, whose entire disclosure is incorporated herein by reference.

What is claimed is:

1. A photodiode comprising:
   a first-conduction-type lower region;
   a second-conduction-type upper region arranged on the lower region;
   a second-conduction-type electrode contact region of a high concentration arranged at a surface of the upper region, the second-conduction-type electrode contact region arranged to connect to an electrode so as to transmit an output signal;

a first-conduction-type first electromagnetic shield region of a high concentration arranged at the surface of the upper region and spaced by an interval from the electrode contact region, wherein the first-conduction-type first shield region is connected to a ground potential; and a first-conduction-type second electromagnetic shield region of a low concentration arranged between the electrode contact region and the first shield region at the surface of the upper region so as to surround the electrode contact region; wherein the first-conduction-type second shield region is connected to the ground potential.

2. A phototransistor comprising:

a device separation region arranged to surround a photodiode region;

the photodiode according to claim 1 arranged inside of the photodiode region; and an output transistor arranged outside of the photodiode region and separated from the photodiode via the device separation region, wherein the output transistor is arranged to amplify a signal to be output from the photodiode.

3. The phototransistor according to claim 2, wherein the electrode contact region is arranged at a peripheral edge of the photodiode region and adjacent to the device separation region.

4. The phototransistor according to claim 3, wherein the device separation region includes a trench extending from the surface of the upper region in a direction towards the lower region, and the phototransistor further comprises a first-conduction-type connection region arranged to connect the second shield region and the lower region to each other along the trench.

5. The phototransistor according to claim 4, wherein the connection region is provided on an entire circumference of an interface between the trench and the upper region, and the first shield region is connected to the lower region via the connection region.

* * * * *